United States Patent
Oie et al.

(10) Patent No.: US 12,300,467 B2
(45) Date of Patent: May 13, 2025

(54) PLASMA PROCESSING METHOD AND PLASMA PROCESSING APPARATUS

(71) Applicant: Tokyo Electron Limited, Tokyo (JP)

(72) Inventors: Manabu Oie, Miyagi (JP); Takanori Banse, Miyagi (JP); Toru Hisamatsu, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 265 days.

(21) Appl. No.: 17/749,149

(22) Filed: May 20, 2022

(65) Prior Publication Data

US 2022/0375724 A1    Nov. 24, 2022

Related U.S. Application Data

(60) Provisional application No. 63/191,001, filed on May 20, 2021.

(51) Int. Cl.
*H01J 37/32* (2006.01)

(52) U.S. Cl.
CPC .. *H01J 37/32449* (2013.01); *H01J 37/32091* (2013.01); *H01J 2237/332* (2013.01); *H01J 2237/3346* (2013.01)

(58) Field of Classification Search
CPC ............. H01L 37/32449; H01J 37/32091
See application file for complete search history.

(56) References Cited

U.S. PATENT DOCUMENTS

| | | | | |
|---|---|---|---|---|
| 6,905,800 B1* | 6/2005 | Yuen | ............ | H01L 21/32137 |
| | | | | 257/E21.256 |
| 9,355,893 B1* | 5/2016 | Chen | ............ | H01L 21/76811 |
| 2015/0000843 A1* | 1/2015 | Koshiishi | .......... | H01J 37/32027 |
| | | | | 156/345.28 |
| 2015/0371869 A1* | 12/2015 | Surla | .......... | C07C 251/08 |
| | | | | 558/461 |
| 2016/0247666 A1* | 8/2016 | Urakawa | .......... | H01J 37/32174 |
| 2017/0148610 A1* | 5/2017 | Wada | ............ | H01J 37/32009 |

FOREIGN PATENT DOCUMENTS

JP     2009-105272 A     5/2009

OTHER PUBLICATIONS

Libre Texts Physics "2.1.2: Period, Frequency, Amplitude, Restoring Force, Phase" via https://phys.libretexts.org/Bookshelves/Waves_and_Acoustics/Book%3A_Sound_-_An_Interactive_eBook_(Forinash_and_Christian)/02%3A_Vibrations/2.01%3A_Vibrations/2.1.02%3A_ (Year: 2024).*

* cited by examiner

*Primary Examiner* — Binh X Tran
(74) *Attorney, Agent, or Firm* — XSENSUS LLP

(57) ABSTRACT

A plasma processing method includes: (a) mounting a substrate including a first mask layer, which is a removal target, formed on a first layer with a metal-containing layer that is included therein to be partially exposed, on a stage disposed inside a processing container of the plasma processing apparatus; (b) supplying a process gas containing one or more of fluorocarbon gas and hydrofluorocarbon gas into the processing container; (c) supplying a first radio-frequency power that forms a plasma from the process gas into the processing container; (d) supplying a second radio-frequency power having a frequency lower than a frequency of the first radio-frequency power to the stage after a predetermined time is elapsed from stop of the first radio-frequency power; and (e) repeating (c) and (d).

18 Claims, 7 Drawing Sheets

PLASMA PROCESSING METHOD AND PLASMA PROCESSING APPARATUS

CROSS-REFERENCE TO RELATED APPLICATION

This application is based on and claims the benefit of U.S. Provisional Application No. 63/191,001 filed on May 20, 2021, with the United States Patent and Trademark Office, the disclosure of which is incorporated herein in its entirety by reference.

TECHNICAL FIELD

The present disclosure relates to a plasma processing method and a plasma processing apparatus.

BACKGROUND

It is known that, in an etching step in which an insulating film formed on a substrate and a metal layer or a metal-containing layer are simultaneously exposed to plasma, a residue caused by a reaction product containing a metal adheres to the substrate. With regard to this, it is proposed that the flow rate of the N2 gas is made larger than the flow rate of the CxFy gas so as to sputter the reaction product to prevent the residue from adhering. See, for example, Japanese Patent Laid-Open Publication No. 2009-105272.

SUMMARY

According to an aspect of the present disclosure, a plasma processing method includes: (a) mounting a substrate including a first mask layer, which is a removal target, formed on a first layer with a metal containing layer that is included therein to be partially exposed, on a stage disposed inside a processing container; (b) supplying a process gas containing one or more of fluorocarbon gas and hydrofluorocarbon gas into the processing container of a plasma processing apparatus; (c) supplying a first radio-frequency power that forms a plasma from the process gas into the processing container; (d) supplying a second radio-frequency power having a frequency lower than a frequency of the first radio-frequency power to the stage after a predetermined time is elapsed from stop of the first radio-frequency power; and (e) repeating (c) and (d).

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In an etching step of a substrate including a plurality of layers, when a Si-containing anti-reflection film (hereinafter, also referred to as Si-ARC) is removed (etched), an exposed metal-containing layer may be exposed to plasma. In this case, the metal-containing layer may not be etched. However, since the selectivity between the Si-ARC and the metal-containing layer is relatively low, the residue containing a metal may be generated. Therefore, the residue may be reduced by improving the selectivity between the Si-containing anti-reflection film and the metal-containing film.

[Configuration of Plasma Processing System]

Figure 1:
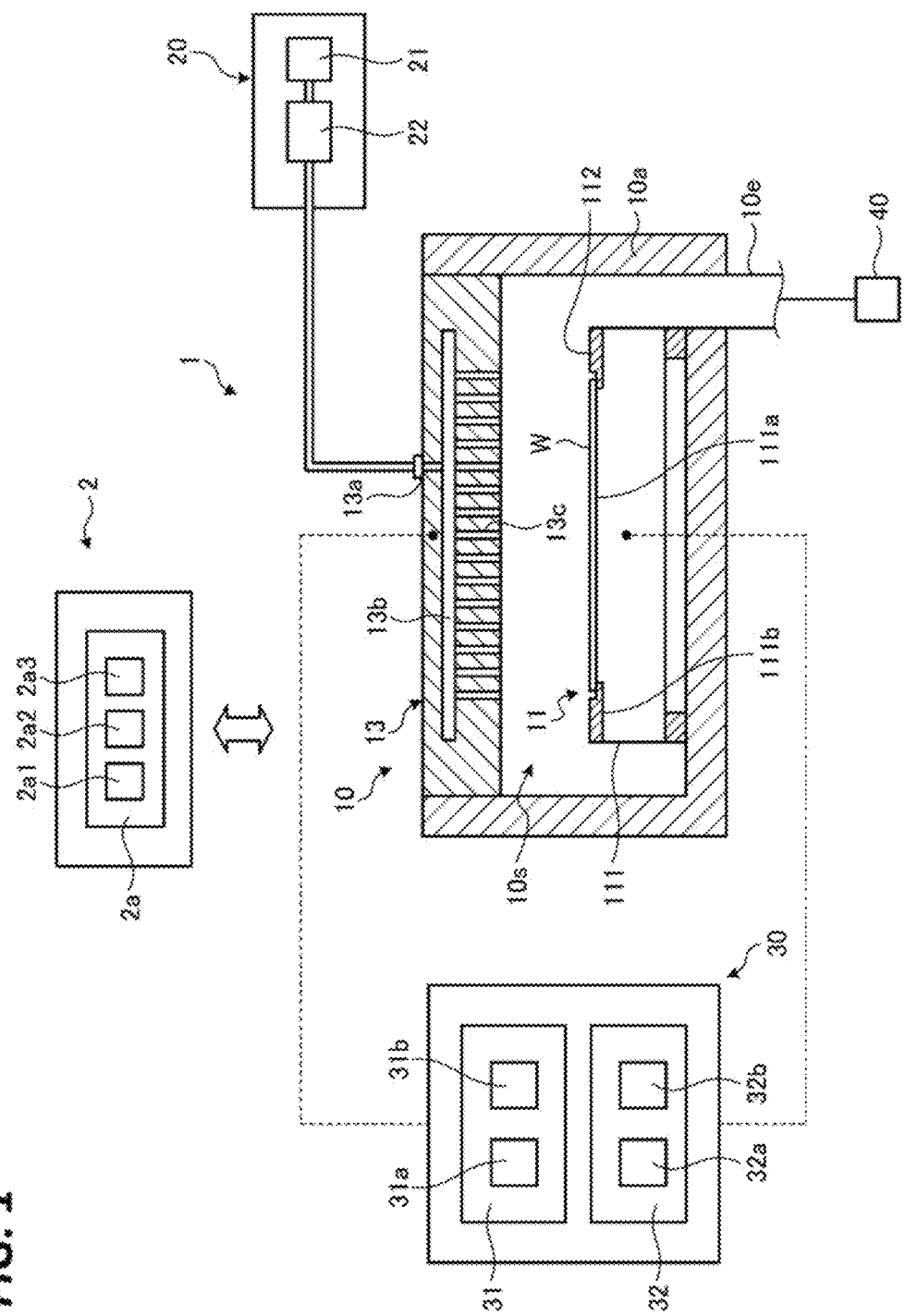
FIG. 1 is a view illustrating an example of a plasma processing system according to an embodiment of the present disclosure.

Hereinafter, an example of a configuration of a plasma processing system will be described. FIG. 1 is a view illustrating an example of a plasma processing system according to an embodiment of the present disclosure. As illustrated in FIG. 1, the plasma processing system includes a capacitively-coupled plasma processing apparatus 1 and a control unit 2. The capacitively-coupled plasma processing apparatus 1 includes a plasma processing chamber 10, a gas supply unit 20, a power supply 30, and an exhaust system 40. Further, the plasma processing apparatus 1 includes a substrate support 11 and a gas introducing unit. The gas introducing unit is configured to introduce at least one processing gas into the plasma processing chamber 10. The gas introducing unit includes a shower head 13. The substrate support 11 is disposed inside the plasma processing chamber 10. The shower head 13 is disposed above the substrate support 11. In the embodiment, the shower head 13 constitutes at least a part of ceiling of the plasma processing chamber 10. The plasma processing chamber 10 has a plasma processing space 10s defined by the shower head 13, a side wall 10a of the plasma processing chamber 10, and the substrate support 11. The plasma processing chamber 10 includes at least one gas supply port configured to supply at least one processing gas to the plasma processing space 10s, and at least one gas discharge port configured to discharge a gas from the plasma processing space. The side wall 10a is grounded. The shower head 13 and the substrate support 11 are electrically insulated from a casing of the plasma processing chamber 10.

The substrate support 11 includes a body 111 and a ring assembly 112. The body 111 has a central area (substrate support surface) 111a that supports a substrate (wafer) W, and an annular area (ring support surface) 111b that supports the ring assembly 112. The annular area 111b of the body 111 surrounds the central area 111a of the body 111 viewed in a plane view. The substrate W is disposed on the central area 111a of the body 111, and the ring assembly 112 is disposed on the annular area 111*b* of the body 111 so as to surround the substrate W on the central area 111*a* of the body 111. In the embodiment, the body 111 includes a base and an electrostatic chuck. The base includes a conductive member. The conductive member of the base functions as a lower electrode. The electrostatic chuck is disposed on the base. An upper surface of the electrostatic chuck has the substrate support surface 111*a*. The ring assembly 112 includes one or more annular members. At least one of the one or more annular members is an edge ring. Further, although not illustrated, the substrate support 11 may include a temperature adjusting module configured to adjust at least one of the electrostatic chuck, the ring assembly 112, and the substrate W to a target temperature. The temperature adjusting module may include a heater, a heat transfer medium, a flow path, or a combination thereof. A heat transfer fluid such as brine or a gas flows through the flow path. Further, the substrate support 11 may include a heat transfer gas supply unit configured to supply a heat transfer gas between a rear surface of the substrate W and the substrate support surface 111*a*.

The shower head 13 is configured to introduce at least one processing gas from the gas supply unit 20 to the plasma processing space 10*s*. The shower head 13 includes at least one gas supply port 13*a*, at least one gas diffusion chamber 13*b*, and a plurality of gas introducing ports 13*c*. The processing gas supplied to the gas supply port 13*a* passes through the gas diffusing chamber 13*b*, and is introduced from a plurality of gas introducing ports 13*c* into the plasma processing space 10*s*. Further, the shower head 13 includes a conductive member. The conductive member of the shower head 13 functions as an upper electrode. In addition to the shower head 13, the gas introducing unit may include one or more side gas injectors (SGI) attached to one or more openings formed in the side wall 10*a*.

The gas supply unit 20 may include at least one gas source 21 and at least one flow rate controller 22. In the embodiment, the gas supply unit 20 is configured to supply at least one processing gas from the corresponding gas source 21 to the shower head 13 via the corresponding flow rate controller 22. Each flow rate controller 22 may include, for example, a mass flow controller or a pressure-control type flow rate controller. Further, the gas supply unit 20 may include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal (RF power) such as a source RF signal or a bias RF signal to the conductive member of the substrate support 11 and/or the conductive member of the shower head 13. Therefore, plasma is formed from at least one processing gas supplied to the plasma processing space 10*s*. Therefore, the RF power supply 31 may function as at least a part of a plasma generation unit configured to generate plasma from one or more processing gases in the plasma processing chamber 10. Further, by supplying the bias RF signal to the conductive member of the substrate support 11, a bias potential is generated in the substrate W, and the ionic component in the formed plasma may be drawn into the substrate W.

In the embodiment, the RF power supply 31 includes a first RF generation unit 31*a* and a second RF generation unit 31*b*. The first RF generation unit 31*a* is configured to be coupled to the conductive member of the substrate support 11 and/or the conductive member of the shower head 13 via at least one impedance matching circuit, and generate the source RF signal (source RF power) for plasma generation. In the embodiment, the source RF signal has a frequency within a range of 13 MHz to 150 MHz. In the embodiment, the first RF generation unit 31*a* may be configured to generate a plurality of source RF signals having different frequencies. The generated one or more source RF signals are supplied to the conductive member of the substrate support 11 and/or the conductive member of the shower head 13. The second RF generation unit 31*b* is configured to be coupled to the conductive member of the substrate support 11 via at least one impedance matching circuit, and generate the bias RF signal (bias RF power). In the embodiment, the bias RF signal has a frequency lower than that of the source RF signal. In the embodiment, the bias RF signal has a frequency within a range of 400 kHz to 40 MHz. In the embodiment, the second RF generation unit 31*b* may be configured to generate a plurality of bias RF signals having different frequencies. The generated one or more bias RF signals are supplied to the conductive member of the substrate support 11. Further, in various embodiments, at least one of the source RF signal and the bias RF signal may be pulsed.

Further, the power supply 30 may include a DC power supply 32 coupled to the plasma processing chamber 10. The DC power supply 32 includes a first DC generation unit 32*a* and a second DC generation unit 32*b*. In the embodiment, the first DC generation unit 32*a* is configured to be connected to the conductive member of the substrate support 11 and generate a first DC signal. The generated first bias DC signal is supplied to the conductive member of the substrate support 11. In the embodiment, the first DC signal may be supplied to another electrode such as an electrode in the electrostatic chuck. In the embodiment, the second DC generation unit 32*b* is configured to be connected to the conductive member of the shower head 13 and generate a second DC signal. The generated second DC signal is supplied to the conductive member of the shower head 13. In various embodiments, at least one of the first and second DC signals may be pulsed. The first and second DC generation units 32*a* and 32*b* may be provided in addition to the RF power supply 31, or the first DC generation unit 32*a* may be provided instead of the second RF generation unit 31*b*.

The exhaust system 40 may be connected to, for example, a gas discharge port 10*e* provided in a bottom portion of the plasma processing chamber 10. The exhaust system 40 may include a pressure adjustment valve and a vacuum pump. The pressure in the plasma processing space 10*s* is adjusted by the pressure adjustment valve. The vacuum pump may include a turbo molecular pump, a dry pump, or a combination thereof.

The control unit 2 processes computer-executable instructions that cause the plasma processing apparatus 1 to execute the various steps described in the present disclosure. The control unit 2 may be configured to control each element of the plasma processing apparatus 1 so as to execute the various steps described here. In the embodiment, a part of or the entire control unit 2 may be included in the plasma processing apparatus 1. The control unit 2 may include, for example, a computer 2*a*. The computer 2*a* may include, for example, a processor (central processing unit: CPU) 2*a*1, a storage unit 2*a*2, and a communication interface 2*a*3. The processor 2*a*1 may be configured to perform various control operations based on a program stored in the storage unit 2*a*2. The storage unit 2*a*2 may include a random access memory (RAM), a read only memory (ROM), a hard disk drive (HDD), a solid state drive (SDD), or a combination thereof.

The communication interface 2a3 may communicate with the plasma processing apparatus 1 via a communication line such as a local area network (LAN).

[Processing Target Substrate]

Figure 2A:
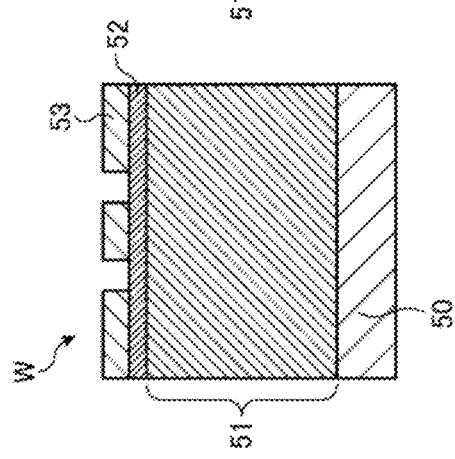
FIGS. 2A to 2C are views schematically illustrating an example of a structure of a substrate etched by a plasma processing apparatus according to the embodiment.
Figure 2B:
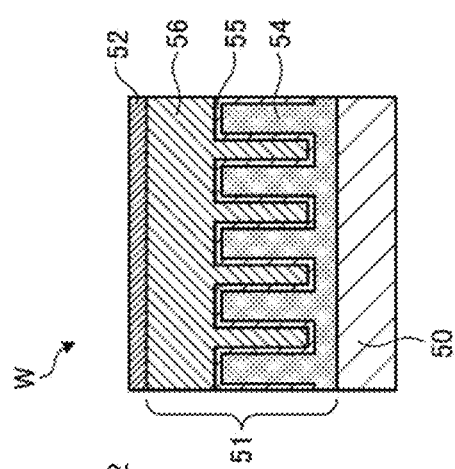
Figure 2C:
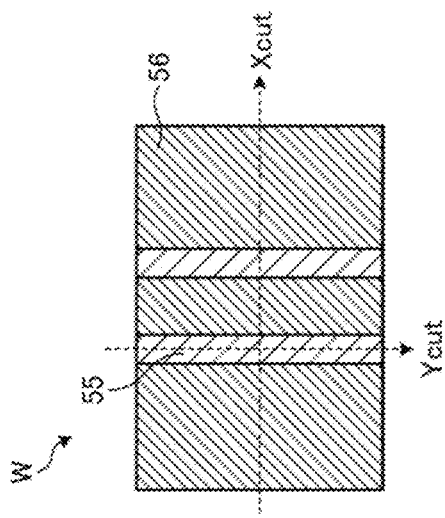

Next, an etching processing target substrate (e.g., a substrate to be processed) will be described with reference to FIGS. 2A to 4B. FIGS. 2A to 2C are views schematically illustrating an example of a structure of a substrate etched by the plasma processing apparatus according to the embodiment. FIG. 2A illustrates an X-axis cross section of the etching processing target substrate W, FIG. 2B illustrates a Y-axis cross section of the substrate W, and FIG. 2C illustrates a plane of the substrate W viewed from above.

The substrate W includes a first layer 51, a first mask layer 52, and a second mask layer 53 on a silicon substrate 50. Further, the first layer 51 includes a fin-shaped insulating layer 54, a metal-containing layer 55 formed on the surface of the insulating layer 54, and a carbon hard mask (CHM) layer 56. In FIG. 2C, in order to illustrate the relationship between the X-axis cross section and the Y-axis cross section of the substrate W and the metal-containing layer 55, a state where the first layer 51 is etched and the first mask layer 52 is removed is illustrated.

The first mask layer 52 is, for example, a Si-containing anti-reflection film (Si-ARC), and is a Si-containing organic film or a Si-containing inorganic film. The second mask layer 53 is, for example, a photoresist. The insulating layer 54 is, for example, a silicon oxide film, and fins are provided to extend in the X-axis direction. The metal-containing layer 55 is, for example, a metal-containing film containing one or more of aluminum (Al), titanium (Ti), and hafnium (Hf). The CHM layer 56 is an organic film containing carbon.

Figure 3A:
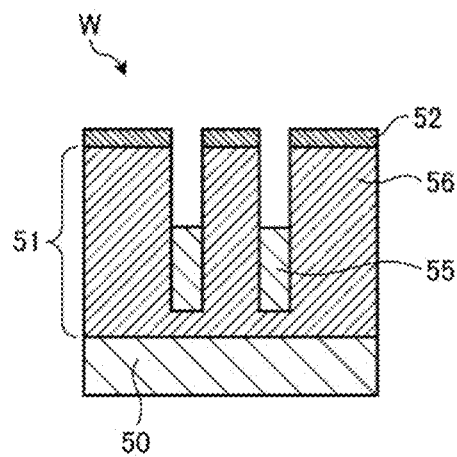
FIGS. 3A and 3B are views schematically illustrating an example of a structure of a substrate in which etching of a first mask layer and a first layer is ended.
Figure 3B:
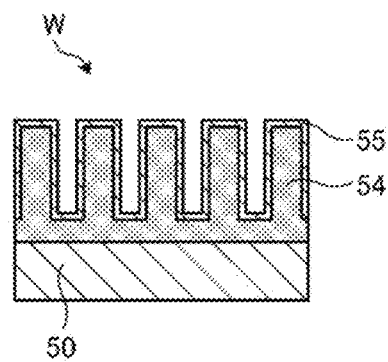

FIGS. 3A and 3B are views schematically illustrating an example of a structure of a substrate in which etching of the first mask layer and the first layer is ended. FIGS. 3A and 3B illustrate a state where, in the substrate W, the first mask layer 52 is etched via the second mask layer 53, and then, the CHM layer 56 in the first layer 51 is etched via the first mask layer 52. As illustrated in FIG. 3A, in the X-axis cross section of the substrate W, the CHM layer 56 is etched in accordance with an opening of the first mask layer 52, and the metal-containing layer 55 is exposed. As illustrated in FIG. 3B, also in the Y-axis cross section of the substrate W, the CHM layer 56 is etched, and the metal-containing layer 55 formed on the fin-shaped surface of the insulating layer 54 is exposed. At this time, the first mask layer 52 remains on the CHM layer 56.

Figure 4A:
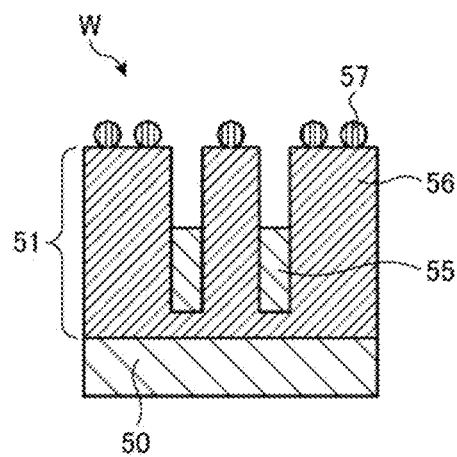
FIGS. 4A and 4B are views schematically illustrating an example of a structure of a substrate in which removal of the first mask layer is ended.
Figure 4B:
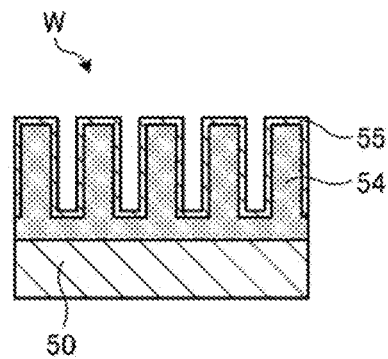

FIGS. 4A and 4B are views schematically illustrating an example of a structure of a substrate in which removal of the first mask layer is ended. FIGS. 4A and 4B illustrate a state where, in the substrate W, the first mask layer 52 is removed by etching. As illustrated in FIG. 4A, in the X-axis cross section of the substrate W, the first mask layer 52 is removed by etching. When the first mask layer 52 is removed and a method for supplying a radio-frequency power in the etching processing is a continuous wave (CW), the selectivity between the first mask layer 52 and the metal-containing layer 55 tends to be relatively low, and thus, residues 57 containing silicon and a metal adhere to the surface of the CHM layer 56. Therefore, in the embodiment, in the etching processing that removes the first mask layer 52, deposition and etching are separately controlled by a supply pattern in which the source RF signal and the bias RF signal of the radio-frequency power are supplied in a pulse, and thus, the selectivity between the first mask layer 52 and the metal-containing layer 55 is improved so that the residue 57 is reduced. That is, in the embodiment, the etching method in which deposition and etching are separately controlled by the supply pattern in which the source RF signal and the bias RF signal of the radio-frequency power are supplied in a pulse is applied to the removal of the mask after a pattern is formed.

[Etching Method]

Figure 5:
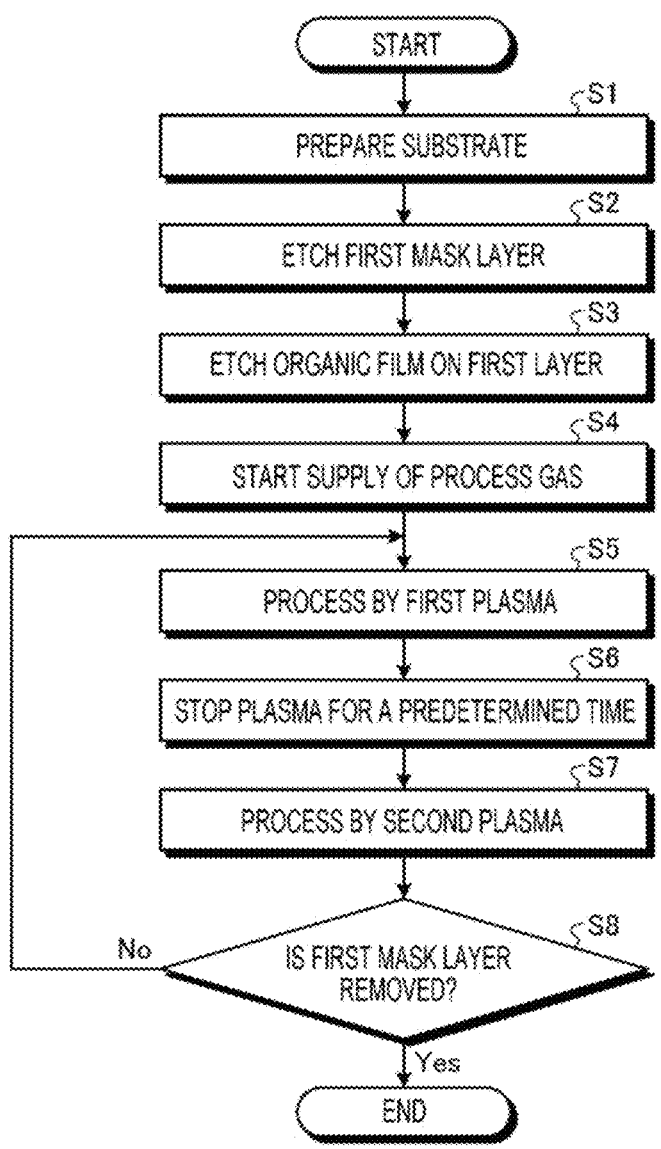
FIG. 5 is a flowchart illustrating an example of an etching processing according to the embodiment.

Next, an etching method according to the embodiment will be described. FIG. 5 is a flowchart illustrating an example of an etching processing according to the embodiment.

In the etching method according to the embodiment, the control unit 2 controls the plasma processing apparatus 1 to open the opening (not illustrated). Then, the substrate W in which the first layer 51, the first mask layer 52, and the second mask layer 53 are formed on the silicon substrate 50 is carried into the plasma processing chamber 10, and is mounted on the central area 111a of the body 111 of the substrate support 11 (stage). The substrate W is held in the central area 111a by supplying a DC voltage to the electrostatic chuck of the body 111. Thereafter, the control unit 2 controls the plasma processing apparatus 1 to close the opening, and controls the exhaust system 40 to exhaust a gas from the plasma processing space 10s so that the atmosphere of the plasma processing space 10s becomes a predetermined vacuum degree. Further, the control unit 2 controls the temperature adjusting module (not illustrated) to adjust the temperature so that the temperature of the substrate W becomes a predetermined temperature (step S1).

Next, the control unit 2 controls the gas supply unit 20 to supply, for example, a mixed gas of $CF_4$, $N_2$, and $CH_3F$ (hereinafter, referred to as $CF_4/N_2/CH_3F$ gas) as a process gas to the gas supply port 13a, in order to etch the first mask layer 52 via the second mask layer 53. The process gas is supplied to the gas supply port 13a, and then passes through the gas diffusing chamber 13b, and is introduced from a plurality of gas introducing ports 13c into the plasma processing space 10s.

The control unit 2 controls the first RF generation unit 31a to supply the source RF signal for plasma excitation to the shower head 13. Further, the control unit 2 controls the second RF generation unit 31b to supply the bias RF signal for bias to the body 111, which is a lower electrode. At this time, the source RF signal and the bias RF signal are supplied in CW. Plasma is generated in the plasma processing space 10s, and generated radicals and ions are drawn into the body 111 side, and the first mask layer 52 of the substrate W is etched (step S2).

Subsequently, the control unit 2 controls the gas supply unit 20 to supply, for example, a mixed gas of $H_2$ and $N_2$ (hereinafter, referred to as $H_2/N_2$ gas) as a process gas to the gas supply port 13a, in order to etch the CHM layer 56, which is an organic film in the first mask layer 56 via the first mask layer 52. Similarly to step S2, the process gas is introduced to the plasma processing space 10s. The control unit 2 controls the first RF generation unit 31a to supply the source RF signal for plasma excitation to the shower head 13. Further, the control unit 2 controls the second RF generation unit 31b to supply the bias RF signal for bias to the body 111, which is a lower electrode. At this time, the source RF signal and the bias RF signal are supplied in CW. Plasma is generated in the plasma processing space 10s, and generated radicals and ions are drawn into the body 111 side, and the CHM layer 56, which is an organic film in the first mask layer 56 of the substrate W is etched (step S3). That is, when the etching processing of step S3 is ended, the substrate W includes the first mask layer 52, which is a removal target, on the first layer 51 in which the metal-containing layer 55 that is included therein is partially exposed.

Next, the control unit 2 controls the gas supply unit 20 to start the supply of the process gas, in order to remove the first mask layer 52 (step S4). The control unit 2 controls the gas supply unit 20 to supply CH4/N2/CH3F gas as a process gas containing one or more of gases of fluorocarbon gas and hydrofluorocarbon gas to the gas supply port 13a. The fluorocarbon may be another compound having a carbon-fluorine bond such as CF2, C3F4, or C4F6. The process gas may contain Ar gas or O2 gas. Similarly to step S2, the process gas is supplied and introduced to the plasma processing space 10s. The conditions of the process gas are the same in steps S5 to S7 (to be described later).

The control unit 2 controls the first RF generation unit 31a to supply the source RF signal (first radio-frequency power) for plasma excitation to the shower head 13. In the plasma processing space 10s, plasma is generated by supplying the source RF signal for plasma excitation to the shower head 13. That is, in the plasma processing space 10s, radicals and ions are generated by the source RF signal. The substrate W is plasma-processed by the generated plasma. That is, the control unit 2 controls such that the substrate W is plasma-processed by first plasma of the process gas generated by supplying the source RF signal (first radio-frequency power) from the first RF generation unit 31a, which is a first radio-frequency power supply (step S5). The first plasma mainly produces fluorocarbon radicals or ions. The substrate W is exposed to the first plasma, and a deposit containing fluorocarbon adheres on the first mask layer 52 and the metal-containing layer 55.

The control unit 2 controls the first RF generation unit 31a to stop the supply of the source RF signal, so that the generation of plasma is stopped for a predetermined time (step S6). At this time, the supply of the bias RF signal from the second RF generation unit 31b is also stopped.

After a predetermined time is elapsed from the stop of the supply of the source RF signal, the control unit 2 controls the second RF generation unit 31b to supply the bias RF signal (second radio-frequency power) for plasma excitation and bias to the body 111, which is a lower electrode. In the plasma processing space 10s, plasma is generated by supplying the bias RF signal for plasma excitation and bias to the body 111. That is, in the plasma processing space 10s, radicals and ions are generated, and ion energy is controlled by the bias RF signal. The substrate W is plasma-processed by the generated plasma. That is, the control unit 2 controls such that the substrate W is plasma-processed by second plasma of the process gas generated by supplying the bias RF signal (second radio-frequency power) from the second RF generation unit 31b, which is a second radio-frequency power supply (step S7). The frequency of the bias RF signal (second radio-frequency power) is lower than the frequency of the source RF signal (first radio-frequency power).

The second plasma mainly produces N ions. When Ar gas is used in the process gas instead of N2 gas, Ar ions are generated instead of N ions. The substrate W is exposed to the second plasma and the first mask layer 52 (Si-ARC) is etched. That is, N ions (Ar ions) are drawn into the body 111 side due to the bias potential, and thus, the substrate W is etched by the interaction between the deposit on the first mask layer 52 and the N ions (Ar ions).

That is, a deposit is deposited on the first mask layer 52 by the radicals of one or more active species of atoms or molecules derived from fluorocarbon, for example, radicals of one or more active species of fluorine and fluorocarbon, and the first mask layer 52 is etched by the interaction between the deposit on the first mask layer 52 and the N ions (Ar ions) drawn by the bias potential. Similarly, in the metal-containing layer 55, the interaction between the deposit on the metal-containing layer 55 and the N ions (Ar ions) drawn by the bias potential occurs and the deposit is etched, but the metal-containing layer 55 is hardly etched.

The control unit 2 determines whether or not the first mask layer 52 is removed by steps S5 to S7, based on information acquired from a sensor (not illustrated) of the plasma processing apparatus 1 or a processing time according to a recipe (step S8). When it is determined that the first mask layer 52 is not removed (No in step S8), the control unit 2 returns the processing to step S5. Meanwhile, when it is determined that the first mask layer 52 is removed (Yes in step S8), the control unit 2 ends the processing. The control unit 2 may include s process of controlling the exhaust system 40 to exhaust the reaction product by controlling the RF power supply 31 to stop the supply of the source RF signal and the bias RF signal, between step S7 and step S8.

When the processing is ended, the control unit 2 controls the gas supply unit 20 to stop the supply of the process gas. Further, the control unit 2 controls the plasma processing apparatus 1 to supply a DC voltage having opposite positive and negative polarities to the electrostatic chuck of the body 111 to eliminate static electricity, and the substrate W is peeled off from the central area 111a. The control unit 2 controls the plasma processing apparatus 1 to open the opening (not illustrated). The substrate W is carried out from the plasma processing space 10s of the plasma processing chamber 10 through the opening. As described above, in the plasma processing system, the residue may be reduced by improving the selectivity between the Si-containing anti-reflection film (Si-ARC) and the metal-containing film.

[Supply Pattern of RF Signal]

Figure 6:
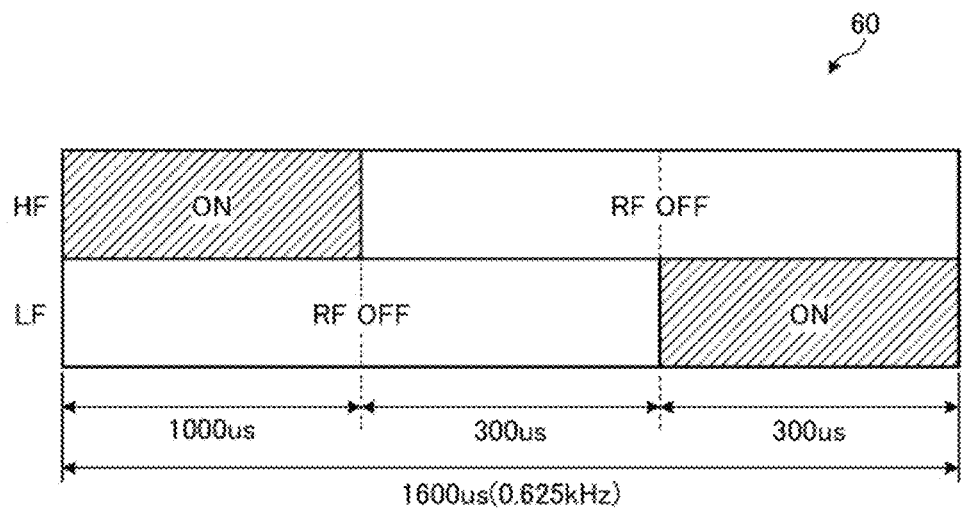
FIG. 6 is a view illustrating an example on one cycle of a RF signal in an etching processing of the first mask layer according to the embodiment.

Next, a supply pattern of the RF signal (radio-frequency power) in steps S5 to S7 will be described with reference to FIG. 6. FIG. 6 is a view illustrating an example of one cycle of the RF signal in the etching processing of the first mask layer according to the embodiment. A supply pattern 60 illustrated in FIG. 6 corresponds to steps S5 to S7 described above. That is, in the embodiment, when the first mask layer 52 is removed, the supply pattern 60 corresponding to steps S5 to S7 is repeated, and thus, deposition and etching are repeated. One cycle of the supply pattern 60 is repeated, for example, at 1,600 μs (0.625 kHz). One cycle of the supply pattern 60 may be, for example, an arbitrary period of 100 ms (10 Hz) or less. Further, in the following descriptions and drawings, the source RF signal may be represented as HF (high frequency), and the bias RF signal may be represented as LF (low frequency).

The supply pattern 60 is divided into three phases of supply of HF for 1,000 μs, stop of HF and LF for 300 μs, and supply of LF for 300 μs, in an order from the beginning. When expressing this in terms of duty (a ratio of power supply time) in one cycle, the supply of HF is 63%, and the supply of LF is 19%. When the period of one cycle of the supply pattern 60 is changed, the corresponding duty may be used. Further, in the supply pattern 60, for example, a radio frequency of 60 MHz is supplied at 200 W as HF, and a radio-frequency power of 40 MHz is supplied at 400 W as LF. The time during which both HF and LF are not supplied may be, for example, 50% or less of one cycle. The supply pattern 60 is repeated for several tens of seconds (e.g., 20 to 30 seconds), so that the first mask layer 52 (Si-ARC) may be removed by etching while the metal-containing layer 55 on the substrate W is not etched.

[Test Result]

Figure 7:
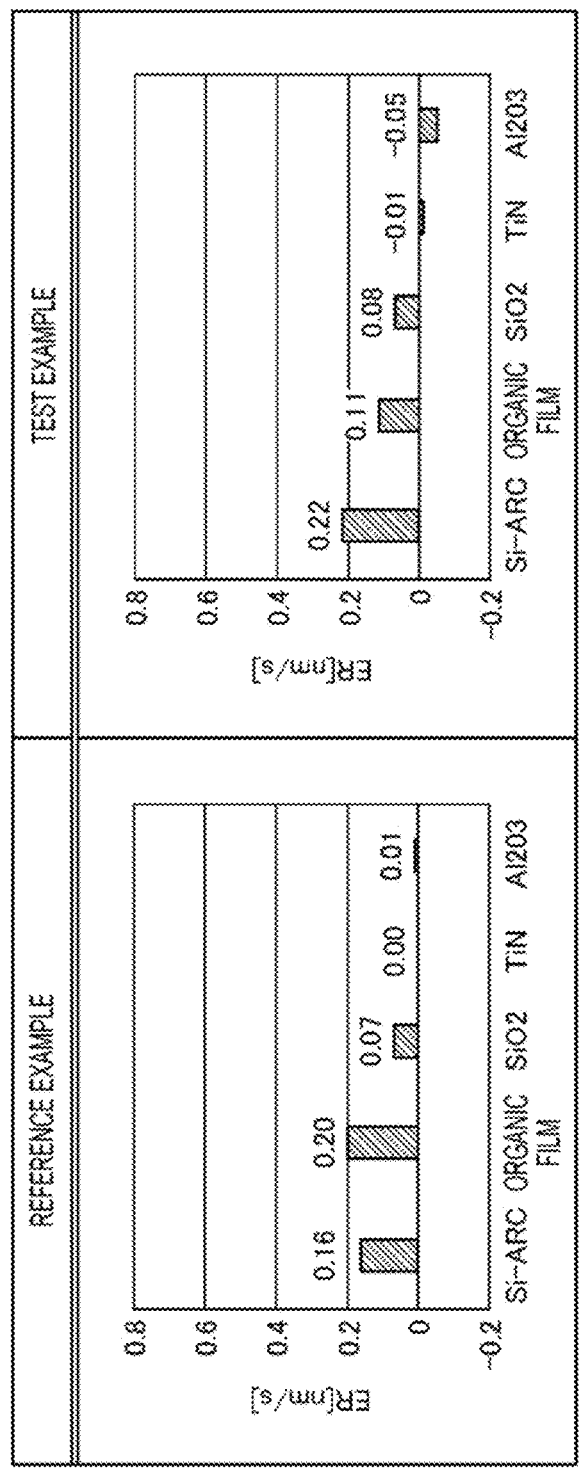
FIG. 7 is a a view illustrating an example of test results of the embodiment and a reference example.
Figure 8:
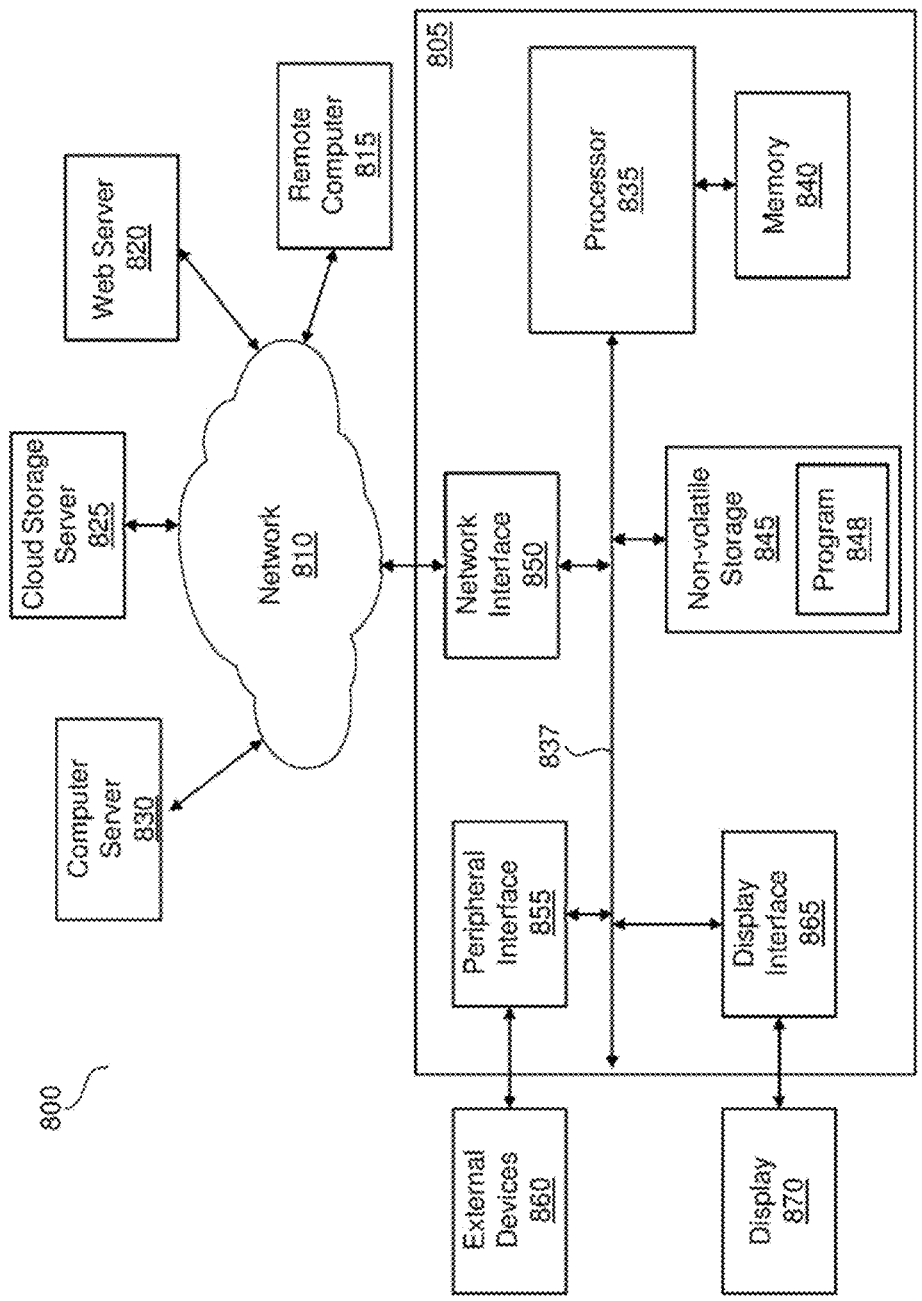
FIG. 8 is a diagram illustrating a network through which a controller communicates with servers.

Subsequently, test results will be described with reference to FIG. 7. FIG. 7 is a a view illustrating an example of test results of the embodiment and Reference Example. FIG. 7 illustrates test results of etching on various films in Reference Example in which the radio-frequency power is supplied in CW, and Test Example corresponding to the supply pattern 60 of the present embodiment. A Si-ARC film, organic film (CH-based film), SiO2 film, TiN film, and Al2O3 film are used as the various film. The organic film (CH-based film) and SiO2 film are included for reference, and the organic film (CH-based film) corresponds to the CHM film. Further, CH3F/O2/Ar gas is used as the process gas instead of CF4/N2/CH3F gas. Further, following processing conditions are used.

[Processing Conditions]

Pressure in plasma processing chamber 10: 40 mTorr (5.33 Pa)

Source RF signal power (60 MHz):

Reference Example: 200 W (CW)

Test Example: 200 W (pulse)

Bias RF signal power (40 MHz):

Reference Example: 110 W (CW)

Test Example: 400 W (pulse)

Pulse frequency of Test Example: 0.6255 kHz

Pulse duty of Test Example: HF/LF/LF offset=63/19/81%

As illustrated in FIG. 7, the etching rates ER in Reference Example are 0.16 [nm/s] in Si-ARC film, 0.20 [nm/s] in the organic film, 0.07 [nm/s] in SiO2 film, 0.00 (0.00242) [nm/s] in TiN film, and 0.01 (0.0091) [nm/s] in Al2O3 film. It can be seen that the selectivity between Si-ARC and TiN is 67, the selectivity between Si-ARC and Al2O3 is 18, and the metal-containing film is also etched.

Meanwhile, the etching rate ER in Test Example are 0.22 [nm/s] in Si-ARC film, 0.11 [nm/s] in the organic film, 0.08 [nm/s] in SiO2 film, −0.01 (−0.006) [nm/s] in TiN film, and −0.05 (−0.054) [nm/s] in Al2O3 film. It can be seen that the selectivity between Si-ARC and TiN is −36.7, and the selectivity between Si-ARC and Al2O3 is −4.1, and the metal-containing film is not etched and in a deposition mode. When CH3F/02/N2 gas is used instead of CH3F/O2/Ar gas, the same results were obtained.

That is, as described in the embodiment, in the removal of Si-ARC, by supplying a radio-frequency power in the supply pattern 60, the selectivity between Si-ARC and the metal-containing film may be improved and the residue may be reduced. Further, the etching rate of Si-ARC is further improved than a case where the radio-frequency power is supplied in CW, and thus, the throughput of the etching processing may be improved.

According to the embodiment, the control unit 2 controls the plasma processing apparatus 1 to perform (a) mounting the substrate W including the first mask layer 52, which is a removal target, on the first layer 51 with the metal-containing layer 55 that is included therein to be partially exposed, on the stage (substrate support 11) disposed inside the processing container (plasma processing chamber 10); (b) supplying the process gas containing one or more of fluorocarbon gas and hydrofluorocarbon gas into the processing container; (c) supplying the first radio-frequency power that forms a plasma from the process gas into the processing container; (d) supplying the second radio-frequency power having a frequency lower than the frequency of the first radio-frequency power to the stage after a predetermined time is elapsed from the stop of the first radio-frequency power; (e) repeating (c) and (d). As a result, it is possible to improve the selectivity between the Si-containing anti-reflection film (first mask layer 52) and the metal-containing film (metal-containing layer 55) to reduce the residue.

Further, according to the embodiment, the first mask layer 52 is a Si-containing anti-reflection film. As a result, the residue may be reduced by improving the selectivity between the Si-containing anti-reflection film and the metal-containing film.

Further, according to the embodiment, the metal-containing layer 55 contains one or more of Al, Ti, and Hf. As a result, the residue may be reduced by improving the selectivity between the Si-containing anti-reflection film and the metal-containing film.

Further, according to the embodiment, the first mask layer 51 is an organic film. As a result, the selectivity between the organic film and the metal-containing film may be improved.

In (e), (c) and (d) are repeated at a period of 100 milliseconds or less. As a result, the residue may be reduced by improving the selectivity between the Si-containing anti-reflection film and the metal-containing film.

The predetermined time is 50% or less of the period. As a result, the residue may be reduced by improving the selectivity between the Si-containing anti-reflection film and the metal-containing film.

Further, according to the embodiment, the control unit 2 controls the plasma processing apparatus 1 to perform (f) etching the first layer 51 before the metal-containing layer 55 is exposed via the first mask layer 52, before (b). As a result, the CHM layer 56 of the first layer 51 may be etched.

Further, according to the embodiment, the control unit 2 controls the plasma processing apparatus 1 to perform (g) etching the first mask layer 52 via the second mask layer 53 formed on the first mask layer 52, before (f). As a result, the pattern of the second mask layer 53 may be transferred to the first mask layer 52.

Further, according to the embodiment, the second mask layer 53 is a photoresist. As a result, the pattern of the photoresist may be transferred to the first mask layer 52.

It should be considered that the embodiments disclosed herein are exemplary and not restrictive in all aspects. The above embodiments may be omitted, replaced, or modified in various forms without departing from the scope of the appended claims and their gist.

Further, in the above described embodiments, the capacitively-coupled plasma processing apparatus 1 that performs a processing such as etching on the substrate W using the capacitively-coupled plasma as a plasma source has been described as an example, but the disclosed technique is not limited thereto. The plasma source is not limited to the capacitively-coupled plasma as long as it performs a processing on the substrate W using plasma, and for example, any plasma source such as inductively-coupled plasma, microwave plasma, or magnetron plasma may be used.

According to the present disclosure, the residue may be reduced by improving the selectivity between a Si-containing anti-reflection film and a metal-containing film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method, comprising:
   (a) mounting a substrate, including a first mask layer formed on a first layer and the first layer including a metal-containing layer therein to be partially exposed, on a stage disposed inside a processing container of a plasma processing apparatus;
   (b) supplying a process gas, containing one or more of fluorocarbon gas and hydrofluorocarbon gas, into the processing container;
   (c) supplying a first radio-frequency power in the processing container to form a plasma from the process gas;
   after a time period has elapsed from a stop of (c), (d) supplying a second radio-frequency power to the stage, the second radio-frequency power having a frequency lower than a frequency of the first radio-frequency power; and
   (e) repeating (c) and (d), wherein
   a duration of (c) is longer than the time period and is longer than a duration of (d).

2. The plasma processing method according to claim 1, wherein the first mask layer is a Si-containing antireflection film.

3. The plasma processing method according to claim 1, wherein the metal containing layer contains one or more of Al, Ti, and Hf.

4. The plasma processing method according to claim 1, wherein the first layer is an organic film.

5. The plasma processing method according to claim 1, wherein the process gas of (b) contains $CF_4$ and $CH_3F$.

6. The plasma processing method according to claim 1, wherein the process gas of (b) contains $N_2$.

7. The plasma processing method according to claim 1, wherein in (c), a deposit containing fluorocarbon is formed on the first mask layer and the metal-containing layer that is partially exposed.

8. The plasma processing method according to claim 1, wherein in (c), the first mask layer is etched by an interaction between a deposit formed on the metal-containing layer and N ions.

9. The plasma processing method according to claim 1, wherein the first radio-frequency power is supplied to a shower head provided in the processing container.

10. The plasma processing method according to claim 1, wherein the duration of (c) is 1000 μs.

11. The plasma processing method according to claim 1, wherein the duration of (d) is 300 μs.

12. The plasma processing method according to claim 1, wherein a duration of the time period is 300 μs.

13. The plasma processing method according to claim 1, wherein in (e), (c) and (d) are repeated at a period of 100 milliseconds or less.

14. The plasma processing method according to claim 13, wherein the predetermined time is 50% or less of the period.

15. The plasma processing method according to claim 1, further comprising:
   (f) etching the first layer before the metal containing layer is exposed via the first mask layer, before (b).

16. The plasma processing method according to claim 15, further comprising:
   (g) etching the first mask layer via a second mask layer formed on the first mask layer, before (f).

17. The plasma processing method according to claim 16, wherein the second mask layer is a photoresist.

18. A plasma processing apparatus comprising:
   a processing container;
   a stage disposed inside the processing container; and
   a controller configured to control the plasma processing apparatus to:
      (a) mount a substrate on the stage, the substrate including a first mask layer formed on a first layer and the first layer including a metal-containing layer therein to be partially exposed;
      (b) supply a process gas, containing one or more of fluorocarbon gas and hydrofluorocarbon gas, into the processing container;
      (c) supply a first radio-frequency power in the processing container to form that forms a plasma from the process gas;
      after a time period has elapsed from a stop of (c), (d) supply a second radio-frequency power to the stage the second radio-frequency power having a frequency lower than a frequency of the first radio-frequency power; and
      (e) repeat (c) and (d), wherein
      a duration of (c) is longer than the time period and is longer than a duration of (d).

* * * * *